(12) United States Patent
Minabe et al.

(10) Patent No.: US 7,835,052 B2
(45) Date of Patent: Nov. 16, 2010

(54) HOLOGRAM RECORDING METHOD AND HOLOGRAM RECORDING DEVICE

(75) Inventors: Jiro Minabe, Kanagawa (JP); Katsunori Kawano, Kanagawa (JP); Yasuhiro Ogasawara, Kanagawa (JP); Koichi Haga, Kanagawa (JP); Shin Yasuda, Kanagawa (JP); Kazuhiro Hayashi, Kanagawa (JP); Hisae Yoshizawa, Kanagawa (JP); Makoto Furuki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 292 days.

(21) Appl. No.: 11/485,962

(22) Filed: Jul. 14, 2006

(65) Prior Publication Data

US 2007/0133113 A1 Jun. 14, 2007

(30) Foreign Application Priority Data

Dec. 12, 2005 (JP) .............................. 2005-357866

(51) Int. Cl.
*G03H 1/16* (2006.01)
*G03H 1/12* (2006.01)

(52) U.S. Cl. .............................. 359/29; 359/10; 359/11; 359/30

(58) Field of Classification Search .................. 359/29, 359/10, 11, 30, 35
See application file for complete search history.

(56) References Cited

U.S. PATENT DOCUMENTS

| | | | | |
|---|---|---|---|---|
| 3,785,712 A | * | 1/1974 | Hannan | 359/26 |
| 4,037,918 A | * | 7/1977 | Kato | 359/29 |
| 5,627,664 A | * | 5/1997 | Trisnadi | 359/11 |
| 5,877,873 A | * | 3/1999 | Bashaw et al. | 359/10 |
| 6,108,110 A | | 8/2000 | Orlov et al. | |
| 6,281,993 B1 | * | 8/2001 | Bernal et al. | 359/29 |
| 6,549,664 B1 | | 4/2003 | Daiber et al. | |
| 2006/0082851 A1 | | 4/2006 | Toishi | |
| 2006/0221421 A1 | | 10/2006 | Kanesaka et al. | |
| 2007/0147801 A1 | | 6/2007 | Yasuda et al. | |
| 2007/0247687 A1 | | 10/2007 | Handschy et al. | |

FOREIGN PATENT DOCUMENTS

| | | |
|---|---|---|
| JP | A-2000-098862 | 4/2000 |
| JP | A-2005-292802 | 10/2005 |
| JP | A-2005-352097 | 12/2005 |

(Continued)

OTHER PUBLICATIONS

Gao et al.; "Improvement to holographic digital data-storage systems with random and pseudorandom phase masks;" *Applied Optics;* vol. 36, No. 20; Jul. 10, 1997; pp. 4853-4861.

(Continued)

*Primary Examiner*—Audrey Y Chang
(74) *Attorney, Agent, or Firm*—Oliff & Berridge, PLC

(57) ABSTRACT

There is proposed a hologram recording method that includes: generating signal light by superimposing a periodic intensity distribution or phase distribution on an intensity distribution of light that expresses binary digital data as a light/dark image; Fourier transforming the signal light; illuminating Fourier transformed signal light and reference light simultaneously on an optical recording medium; and recording the signal light as a hologram.

4 Claims, 14 Drawing Sheets

FOREIGN PATENT DOCUMENTS

JP  A-2006-234990  9/2006
JP  A-2006-276373  10/2006

OTHER PUBLICATIONS

Apr. 20, 2010 Office Action issued in Japanese Patent Application No. 2005-357866 (with translation).

Jun. 12, 2009 Office Action issued in U.S. Appl. No. 11/790,016.
Dec. 31, 2009 Office Action issued in U.S. Appl. No. 11/790,016.
Jul. 19, 2010 Notice of Allowance issued in U.S. Appl. No. 11/790,016.
Qiang Gao et al., Improvement to Holographic Digital Data-Storage Systems With Random and Psuedorandom Phase Masks, Applied Optics, vol. 36, No. 20, pp. 4853-4861, Jul. 10, 1997.

* cited by examiner $\frac{\lambda f}{T}$

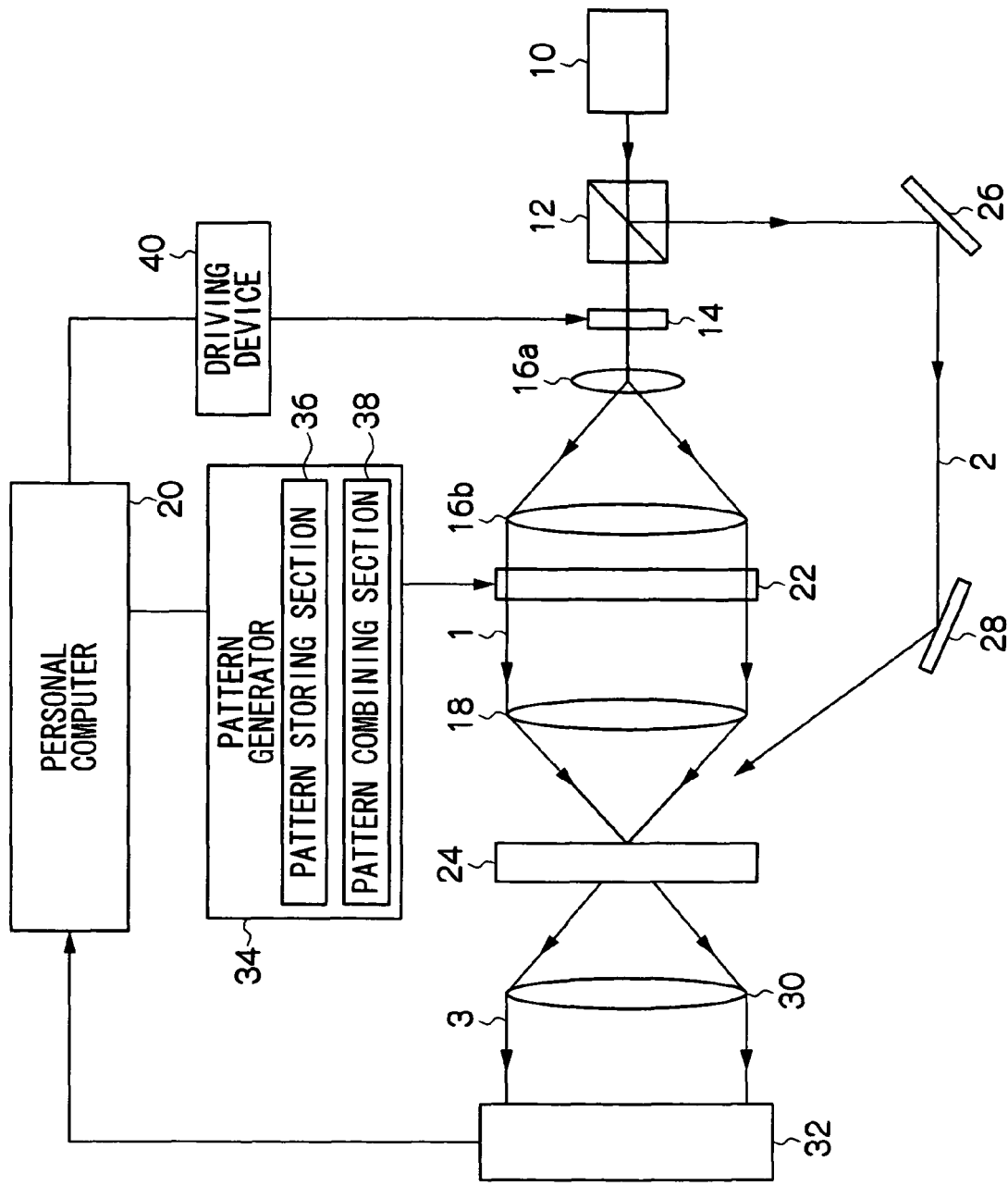

F I G. 9 A
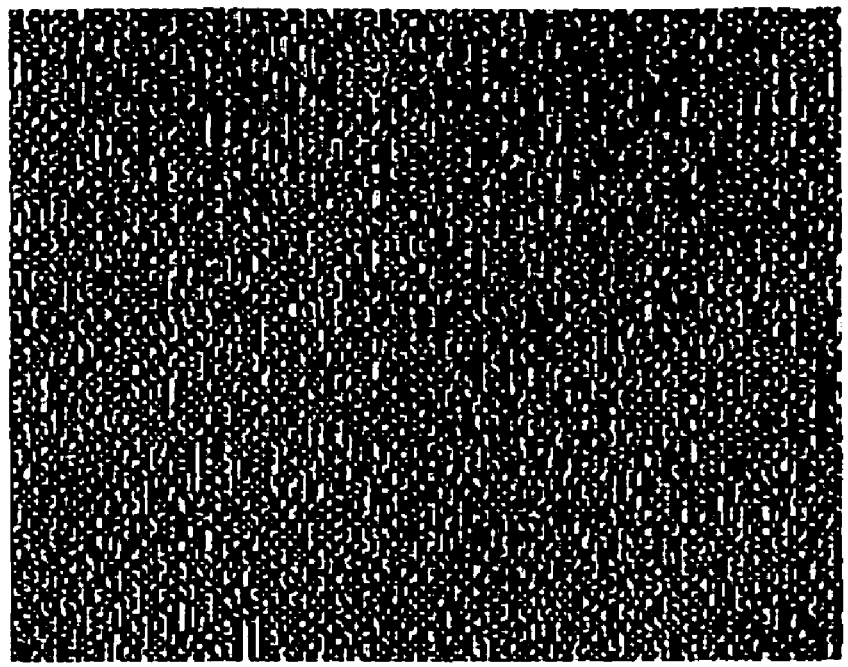
F I G. 9 B
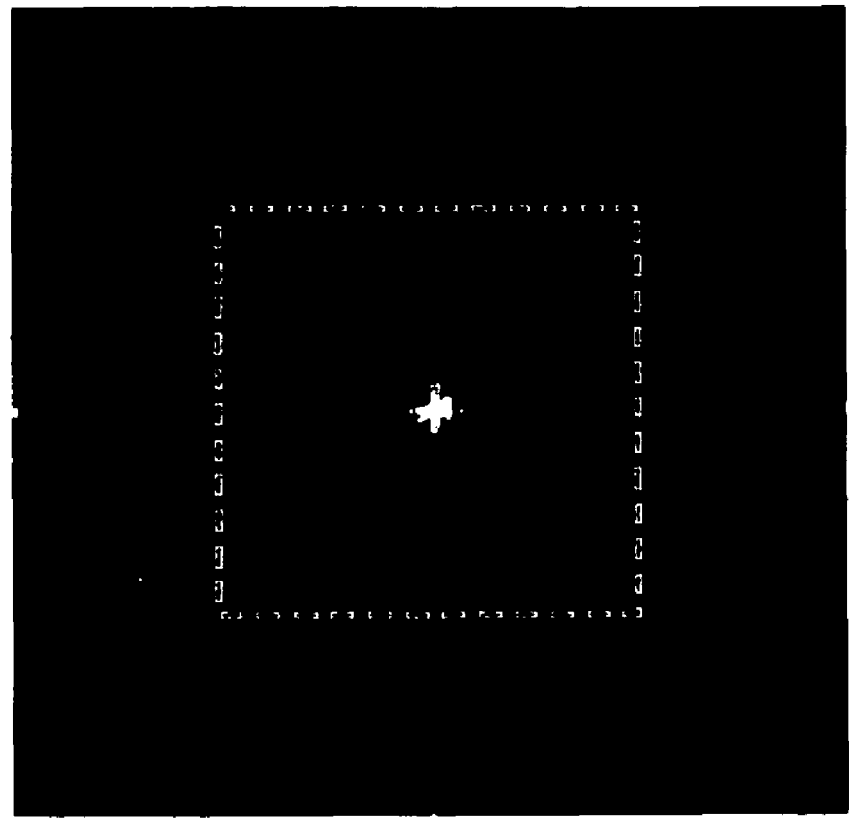

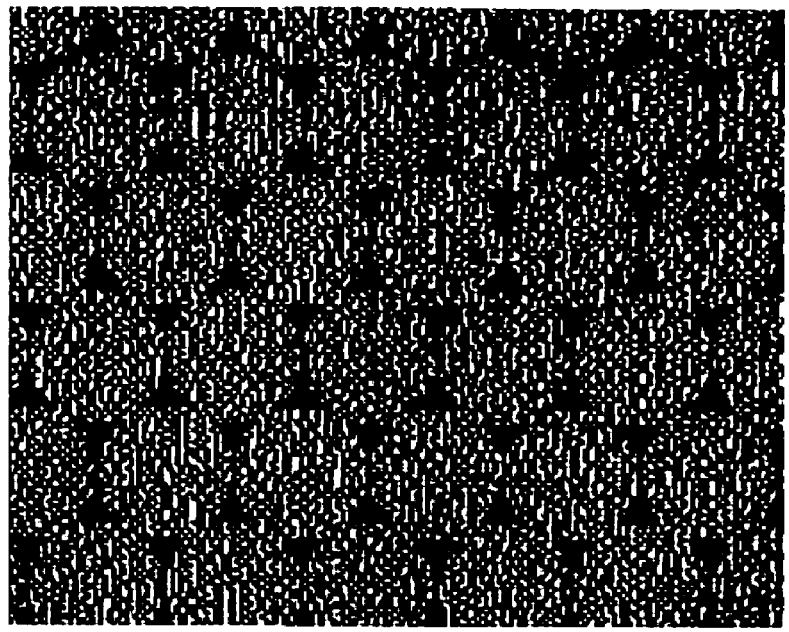
F I G. 1 0 A
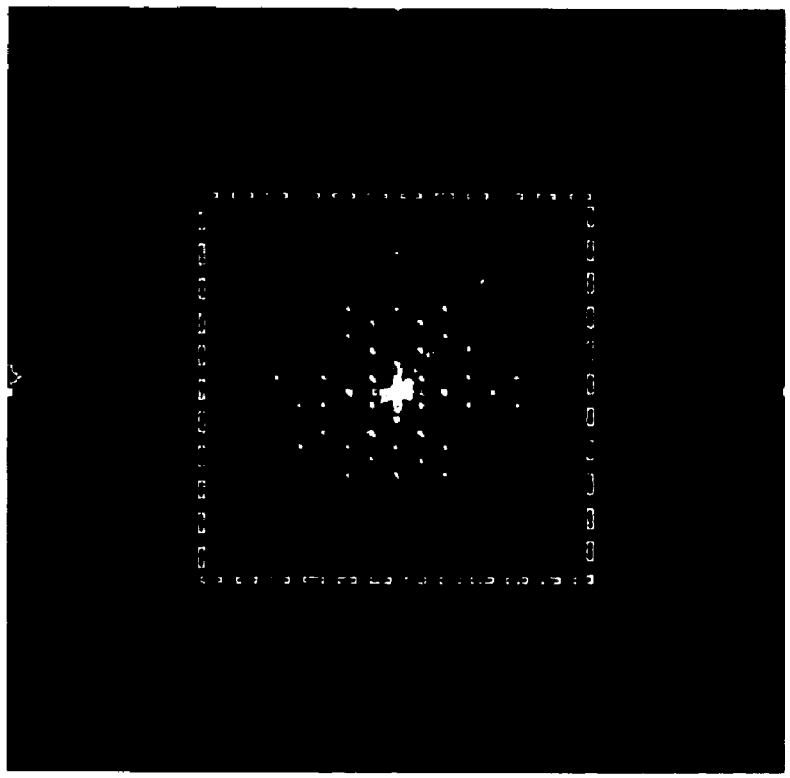
F I G. 1 0 B

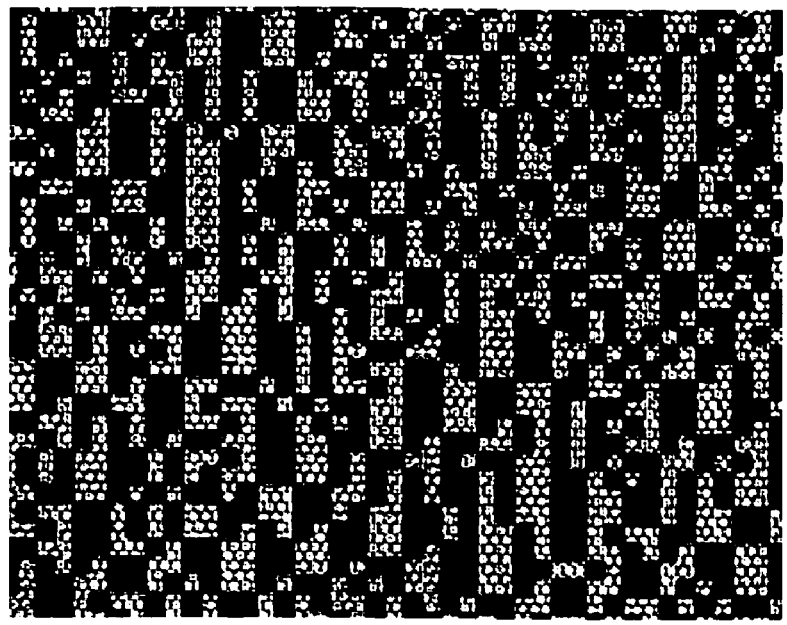
F I G. 1 4 A
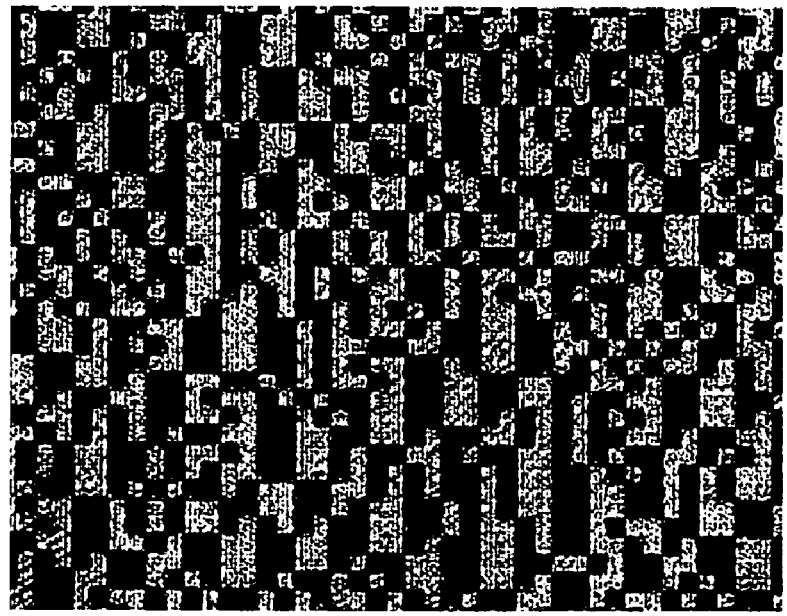
F I G. 1 4 B

FIG. 17
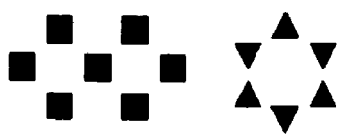
FIG. 18A  FIG. 18B  FIG. 18C  FIG. 18D
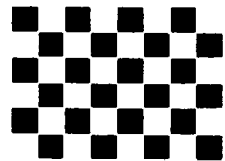 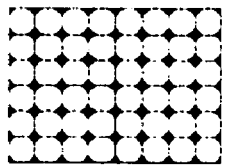 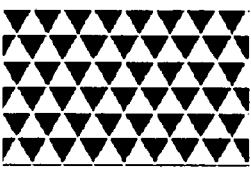 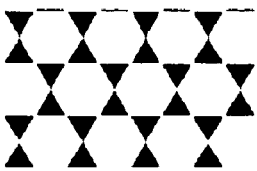
 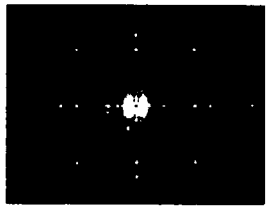 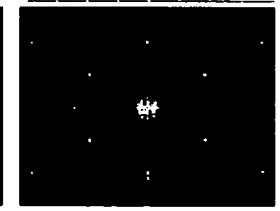 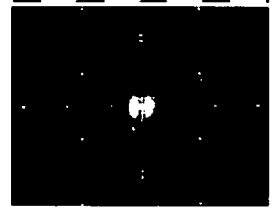

HOLOGRAM RECORDING METHOD AND HOLOGRAM RECORDING DEVICE

BACKGROUND

1. Technical Field

The present invention relates to a hologram recording method and a hologram recording device, and in particular, to a hologram recording method and a hologram recording device that Fourier transform signal light, which expresses binary digital data as a light/dark image, and record a Fourier transform image as a hologram.

2. Related Art

In holographic data storage, binary digital data "0, 1" is made into a digital image (signal light) as "light image, dark image", and the signal light is Fourier transformed by a lens and is illuminated onto an optical recording medium. A Fourier transform image is recorded on the optical recording medium as a hologram. However, a Fourier transform image of digital data has an extremely strong peak intensity at the 0-order. Therefore, in holographic data storage, there are the problems that the dynamic range of the optical recording medium is wasted by the 0-order light component (dc component) and the S/N (signal-noise ratio) decreases.

SUMMARY

According to an aspect of the present invention, there is provided a hologram recording method that includes: generating signal light by superimposing a periodic intensity distribution or phase distribution on an intensity distribution of light that expresses binary digital data as a light/dark image; Fourier transforming the signal light; illuminating Fourier transformed signal light and reference light simultaneously on an optical recording medium; and recording the signal light as a hologram.

BRIEF DESCRIPTION OF THE DRAWINGS

Exemplary embodiments of the present invention will be described in detail based on the following figures, wherein:

FIG. 5 is a drawing showing the schematic structure of a hologram recording/playback device relating to a first exemplary embodiment;

FIG. 9A is a drawing showing the results of Example 2;

FIG. 9B is a drawing showing the results of Example 2;

FIG. 10A is a drawing showing the results of Example 2;

FIG. 10B is a drawing showing the results of Example 2;

FIG. 14A is a playback image in a case in which the periodic mask is placed at an imaging plane;

FIG. 14B is a playback image in a case in which the periodic mask is placed at a non-imaging plane;

FIG. 17 is a drawing showing an example of a periodic pattern in which the dark portion and the light portion are isolated from one another;

FIG. 18A is a drawing showing a Fourier transform image in one of cases in which various periodic patterns are superimposed;

FIG. 18B is a drawing showing a Fourier transform image in one of cases in which various periodic patterns are superimposed;

FIG. 18C is a drawing showing a Fourier transform image in one of cases in which various periodic patterns are superimposed; and FIG. 18D is a drawing showing a Fourier transform image in one of cases in which various periodic patterns are superimposed.

DETAILED DESCRIPTION

Examples of embodiments of the present invention will be described in detail hereinafter with reference to the drawings.

(Principles of Making the S/N High)

Figure 1A:
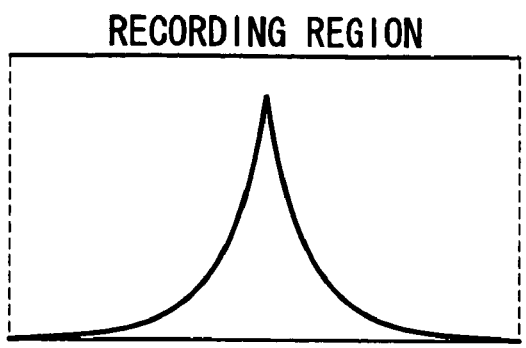
FIG. 1A is a drawing for explaining the principles of making the S/N high.
Figure 1B:
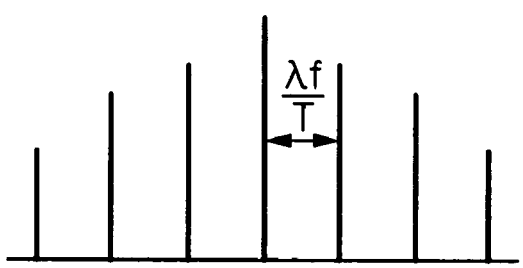
FIG. 1B is a drawing for explaining the principles of making the S/N high.
Figure 1C:
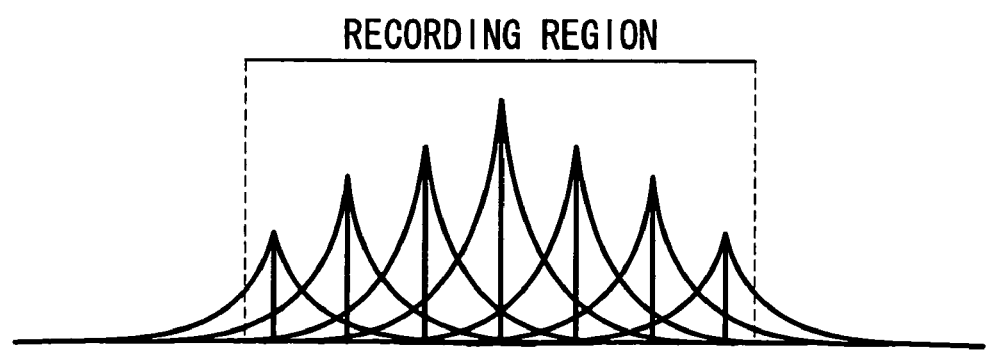
FIG. 1C is a drawing for explaining the principles of making the S/N high.

FIGS. 1A through 1C are drawings for explaining the principles of making the S/N high.

A Fourier transform image of a digital pattern (signal light) has an extremely strong peak intensity at the 0-order. Therefore, as shown in FIG. 1A, the Fourier transform spectrum at the recording region of the hologram has substantially a single peak, and the intensity distribution thereof is very sharp. On the other hand, as shown in FIG. 1B, a periodic pattern has a discrete intensity distribution corresponding to the period structure of the pattern. The envelope thereof is a function of the aperture ratio of the periodic pattern.

In the present invention, a periodic intensity distribution or phase distribution is superimposed on the intensity distribution of the signal light. The Fourier transform spectrum of a digital pattern on which a periodic pattern is superimposed is, as shown in FIG. 1C, expressed by the convolution integral of the Fourier transform spectrum of the digital pattern and the Fourier transform spectrum of the periodic pattern, and the intensity peaks are dispersed. By superimposing a periodic pattern on a digital pattern in this way, the intensity distribution of the Fourier transform image to be recorded can be made to be uniform, and the S/N of the playback data is improved.

A periodic pattern having a frequency component lower than the maximum frequency of the digital pattern is used as the aforementioned periodic pattern. The length of one side of the recording region (one side in a case in which the recording region is substantially square), which is the minimum needed in order to play-back digital data, is expressed as $\lambda f/d$, where the length of one side of a pixel structuring the digital pattern is d, the recording wavelength is $\lambda$, and the focal length of the Fourier transform lens is f. On the other hand, the interval between the discrete intensity peaks of the periodic pattern is expressed as $\lambda f/T$, where the pattern period is T.

Accordingly, in order to form plural intensity peaks at the minimum necessary recording region, the frequency $1/T$ of the periodic pattern must be lower than the maximum frequency $1/2d$ of the digital pattern, i.e., the pattern period T must satisfy the condition $T>2d$. Due to the pattern period T satisfying the condition $T>2d$, a Fourier transform image having plural intensity peaks within the minimum required recording region can be formed, and a high S/N can be realized even if the recording region is made to be minute.

Next, the results of a simulation using fast Fourier transform (FFT) will be shown.

Figures 2A, 2B:
FIG. 2A is a drawing showing an example of a digital pattern.
FIG. 2B is a drawing showing a Fourier transform image of the FIG. 2A.
Figures 3A, 3B:
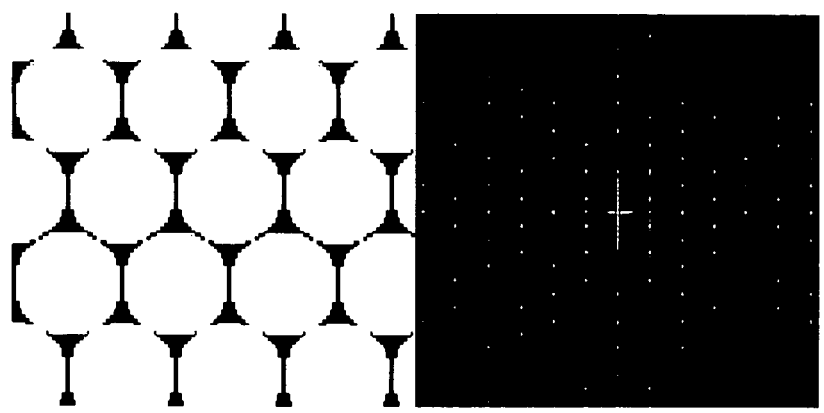
FIG. 3A is a drawing showing an example of a periodic pattern.
FIG. 3B is a drawing showing a Fourier transform image of the FIG. 3A.
Figures 4A, 4B:
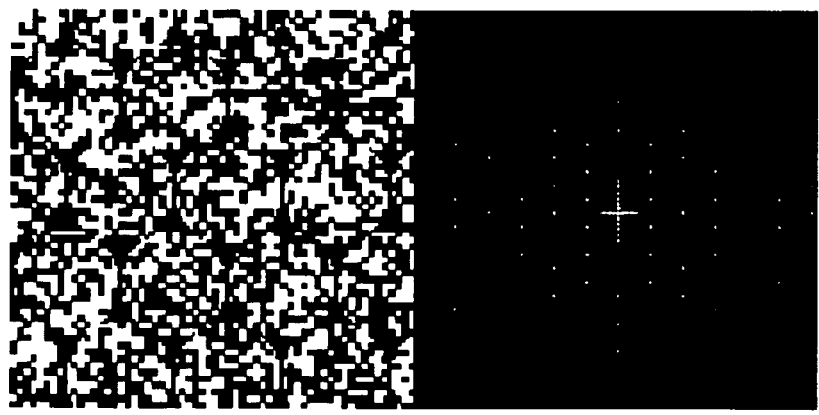
FIG. 4A is a drawing showing an example of a digital pattern on which a periodic pattern is superimposed.
FIG. 4B is a drawing showing a Fourier transform image of the FIG. 4A.

FIG. 2A is a drawing showing an example of a digital pattern. In this example, binary digital data "0, 1" are made into digital images as "light, dark". As shown in FIG. 2B, the Fourier transform image of the digital pattern spreads in accordance with the frequency distribution of the digital pattern, and has an extremely strong peak intensity (dc component) at the 0-order. FIG. 3A is a drawing showing an example of a periodic pattern. This periodic pattern is a pattern in which circular light portions are arranged periodically with respect to the background which is dark portions. As shown in FIG. 3B, the Fourier transform image of the periodic pattern has a discrete intensity distribution corresponding to the period structure of the pattern. FIG. 4A is a drawing showing an example of a digital pattern on which a periodic pattern is superimposed. The periodic pattern shown in FIG. 3A is superimposed on the digital pattern shown in FIG. 2A. In the Fourier transform image of this digital pattern, the intensity peaks are effectively dispersed as shown in FIG. 4B.

First Exemplary Embodiment

FIG. 5 is a drawing showing the schematic structure of a hologram recording/playback device relating to a first exemplary embodiment.

A light source 10, which oscillates laser light which is coherent light, is provided in this hologram recording/playback device. A beam splitter 12, which divides the laser light into light for signal light and light for reference light, is disposed at the laser light illuminating side of the light source 10. A shutter 14, which is for blocking the light for signal light transmitted through the beam splitter 12, is disposed at the light transmitting side of the beam splitter 12, so as to be able to be inserted onto and withdrawn from the optical path. Collimator lenses 16a, 16b, and a lens system structured by a Fourier transform lens 18, are disposed in that order at the light transmitting side of the shutter 14.

A transmitting-type spatial light modulator 22, which is structured by a liquid crystal display element or the like and modulates the laser light for signal light in accordance with digital data supplied from a personal computer 20 and generates a digital pattern (signal light 1) for each page, is disposed between the collimator lens 16b and the Fourier transform lens 18. Reflecting mirrors 26, 28, which reflect laser light for reference light (reference light 2) reflected at the beam splitter 12 and which are for changing the optical path to the direction of an optical recording medium 24, are disposed at the light reflecting side of the beam splitter 12.

A Fourier transform lens 30, and a light detector 32, which is structured by an image pickup element such as a CCD or a CMOS sensor array or the like and which converts received playback light (diffracted light 3) into electric signals and outputs the electric signals, are disposed at the playback light transmitting side of the optical recording medium 24. The light detector 32 is connected to the personal computer 20.

The personal computer 20 is connected to the spatial light modulator 22 via a pattern generator 34 which generates a pattern to be displayed on the spatial light modulator 22. The pattern generator 34 has a pattern storing section 36 which stores a periodic pattern, and a pattern combining section 38 which superimposes a periodic pattern on a pattern corresponding to digital data. Further, a driving device 40, which drives the shutter 14 so as to insert it on and withdraw it from the optical path, is connected to the personal computer 20.

Hologram recording using the above-described recording/playback device will be described next.

First, the shutter 14 is withdrawn from the optical path by the driving device 40, such that laser light can be transmitted through. The laser light oscillated from the light source 10 is separated into light for signal light and light for reference light by the beam splitter 12. The laser light transmitted through the beam splitter 12 is collimated into a large-diameter beam by the collimator lenses 16a, 16b, and is illuminated onto the spatial light modulator 22 as light for signal light.

Digital data is inputted to the pattern generator 34 from the personal computer 20. At the pattern generator 34, a pattern to be displayed on the spatial light modulator 22 is generated in accordance with the supplied digital data. In the present exemplary embodiment, the periodic pattern is read-out from the pattern storing section 36, and, at the pattern combining section 38, the periodic pattern is superimposed on the generated pattern such that a combined pattern is generated. At the spatial light modulator 22, the combined pattern generated at the pattern generator 34 is displayed, laser light for signal light is intensity-modulated in accordance with the displayed combined pattern, and the signal light 1 is generated.

The generated signal light 1 is Fourier transformed by the Fourier transform lens 18, and is illuminated onto the optical recording medium 24. Simultaneously, the laser light reflected at the beam splitter 12 is reflected at the reflecting mirrors 26, 28, and is illuminated onto the optical recording medium 24 as the reference light 2. The reference light 2 is illuminated onto the region where the signal light 1, after Fourier transformation, is illuminated. In this way, the signal light 1 after Fourier transformation and the reference light 2 interfere within the optical recording medium 24, and the signal light 1 is recorded as a hologram within the optical recording medium 24.

At the time of playback of the hologram, the shutter 14 is inserted onto the optical path by the driving device 40, and blocks the light for signal light. In this way, only the reference light 2 is illuminated onto the region of the optical recording medium 24 where the hologram is recorded. The illuminated reference light 2 is diffracted by the hologram. Because a Fourier transform image is recorded on the optical recording medium 24, due to the diffracted light 3 being inverse Fourier transformed by the Fourier transform lens 30, the playback image can be observed at the focal plane of the Fourier transform lens 30. This playback image is detected by the light detector 32, and the digital data held by the signal light can be read.

In conventional hologram recording, because the Fourier transform image of the digital pattern (signal light) has an extremely strong peak intensity at the 0-order, the Fourier transform spectrum at the recording region of the hologram has substantially a single peak, and the intensity distribution thereof is sharp. In order to efficiently record a hologram, the reference light intensity must be made to match this high peak intensity, and generally, the light intensity of the reference light must be raised to about 10 times or more the average light intensity of the signal light.

In the present invention, the periodic pattern is read-out from the pattern storing section 36, the periodic pattern is superimposed on the generated pattern at the pattern combining section 38, and a combined pattern is generated. Therefore, as shown in FIG. 1C and FIG. 4, the signal light intensity can be made to be uniform. In this way, the light intensity of the reference light can be decreased to about 1/10 of the conventional value.

Because the exposure energy needed for recording can be greatly decreased in this way, the dynamic range of the optical recording medium can be utilized effectively, and recording and playback of a high S/N (signal-noise ratio) are possible. Here, by offsetting (defocusing) the position of the optical recording medium from the focal point position of the Fourier transform lens, the signal light intensity can be made to be even more uniform.

Signal lights, at which periodic intensity distributions or phase distributions were superimposed, were generated by using combined patterns in which various periodic patterns were superimposed. These signal lights were recorded as holograms on optical recording media, and the bit error rates (BER) and S/N of the playback data were evaluated.

Figure 15:
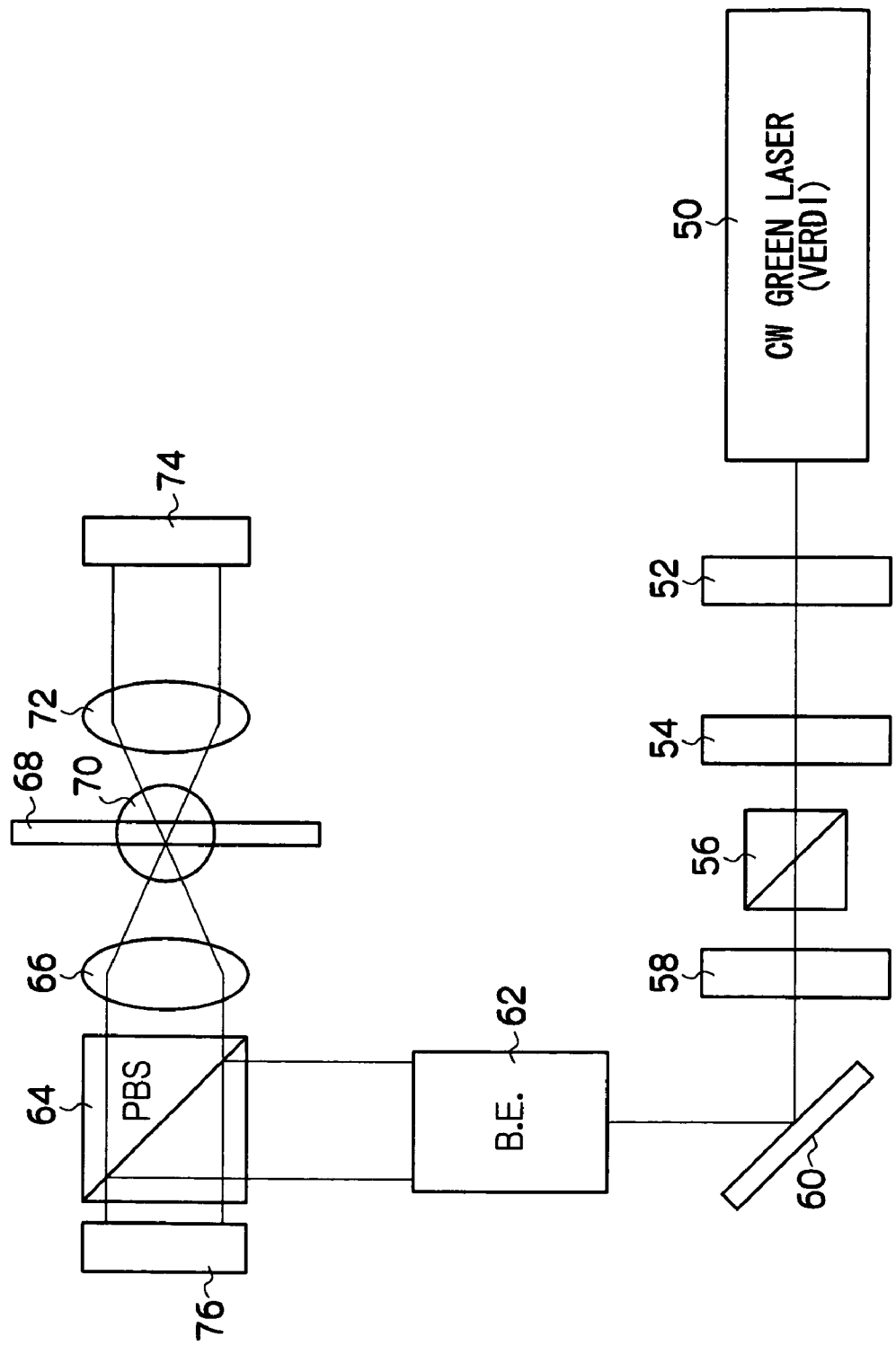
FIG. 15 is drawing showing the schematic structure of a hologram recording/playback device for evaluation.

FIG. 15 is a drawing showing the schematic structure of the hologram recording/playback device for evaluation. A coaxial optical system type hologram playback/recording device, in which the signal light and the playback light were collected at the same lens, was used in the evaluation. A light source 50, which continuously oscillates laser light which is coherent light, is provided at the hologram recording/playback device. A shutter 52 for blocking laser light is disposed at the laser light illuminating side of the light source 50, so as to be able to be inserted on and withdrawn from the optical path. The shutter 52 is driven by a driving device (not shown) on the basis of control signals from a computer (not shown).

A half-wave plate 54, a polarization beam splitter 56, and a half-wave plate 58 are disposed in that order at the light transmitting side of the shutter 52. Because the polarization beam splitter 56 transmits only polarized light of a predetermined direction, the laser light intensity can be adjusted by rotating the half-wave plate 54. A mirror 60 for changing the optical path of the laser light is disposed at the light transmitting side of the half-wave plate 58. A beam expander 62, which is for collimating the incident beams into a large-diameter beam, is disposed at the light reflecting side of the mirror 60.

A polarization beam splitter 64, which transmits only polarized light of a predetermined direction, is disposed at the light transmitting side of the beam expander 62. A reflecting-type spatial light modulator 76, which modulates laser light in accordance with digital data supplied from a personal computer (not shown) and generates reference light and a digital pattern (signal light) per page, is disposed at the light reflecting side of the polarization beam splitter 64.

A Fourier transform lens 66, which illuminates signal light and reference light onto an optical recording medium 68 held at a stage 70, is disposed at the transmitting side of the signal light and the like of the polarization beam splitter 64. Further, a Fourier transform lens 72, and a light detector 74, which is structured by an image pickup element such as a CCD or a CMOS sensor array or the like and which converts received playback light into electric signals and outputs the electric signals, are disposed at the playback light exiting side of the optical recording medium 68. The light detector 74 is connected to a personal computer (not shown).

Note that a pair of relay lenses may be disposed between the polarization beam splitter 64 and the Fourier transform lens 66. Further, a pair of relay lenses can be disposed between the Fourier transform lens 72 and the light detector 74.

In the above-described hologram recording/playback device, the laser light collimated at the beam expander 62 is incident on the polarization beam splitter 64, and is reflected in the direction of the spatial light modulator 76. At the spatial light modulator 76, the polarization direction (phase) of the laser light is modulated in accordance with the pattern of the reference light and the signal light. For example, the central portion of the spatial light modulator 76 can be used for data display (i.e., for the signal light), and the peripheral portion can be used for the reference light.

By passing through the polarization beam splitter 64, the signal light and the reference light, which were polarization-modulated at the spatial light modulator 76, become an intensity pattern, and are Fourier transformed by the lens 66. The Fourier transformed signal light and reference light are illuminated simultaneously and coaxially onto the optical recording medium 68. Due to only reference light being generated at the spatial light modulator 76, the Fourier transformed reference light is illuminated onto the optical recording medium 68.

EXAMPLE 1

Checkered Pattern

An experiment was carried out by using the hologram recording/playback device shown in FIG. 15. A continuous oscillation green laser "Verdi" (wavelength: 532 nm) manufactured by Coherent Inc. was used as the light source 50. An LCD spatial light modulator "LCoS" (pixels: 1024 (horizontal)×768 (vertical), pixel pitch: 19 μm, pickup surface area: 19.6 mm×14.6 mm) manufactured by Holoeye Photonics AG was used as the reflecting-type spatial light modulator 76. A CMOS sensor array (pixels: 1280 (horizontal)×1024 (vertical), pixel pitch: 6.7 μm, pickup surface area: 8.6 mm×6.9 mm) manufactured by Lumenera Corporation was used as the light detector 74. Objective lenses (NA: 0.6, focal length: 10 mm) of a high NA (numerical aperture) used in microscopes and the like were used as the Fourier transform lenses 66, 72.

A 24×24 pixel checkered pattern of the spatial light modulator was superimposed on a pattern expressed by a differential coding method in which 3×3 pixels of the spatial light modulator were made to be 1 pixel structuring the digital data and one bit was expressed by two of these pixels. The combined pattern in which the checkered pattern was superimposed was displayed on the reflecting-type spatial light modulator, laser light of a wavelength of 532 nm was illuminated on the spatial light modulator, and signal light (a digital pattern) in which a periodic intensity distribution was superimposed was generated. The length of one side of the pixels structuring the digital pattern was 57 μm (three pixels of the spatial modulator). This signal light and reference light of the same wavelength were illuminated onto an optical recording medium via the same Fourier transform lens, and the Fourier transform image of the digital pattern was recorded as a hologram.

Figure 6A:
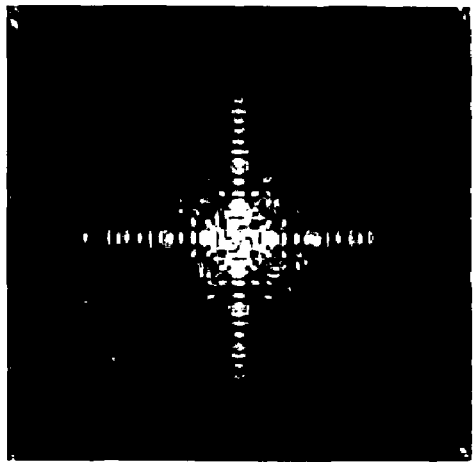
FIG. 6A is a drawing showing a result of Example 1.
Figure 7A:
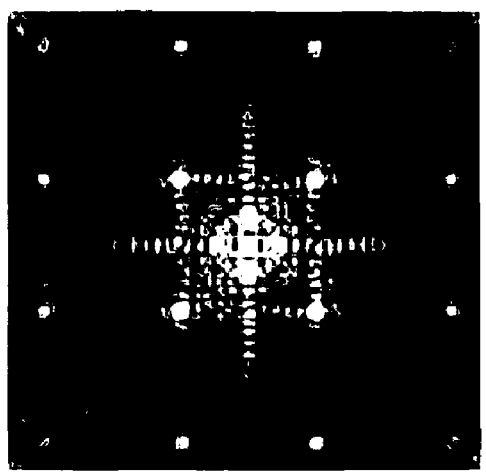
FIG. 7A is a drawing showing a result of Example 1.

For comparison, the pattern before superimposition of the checkered pattern was displayed on the spatial light modulator and a digital pattern was generated, and in the same way as described above, the Fourier transform image of the digital pattern was recorded as a hologram. Here, results of a simulation using FFT are shown. As shown in FIG. 6A, a strong dc component (0-order light component) exists in the Fourier transform image of the digital pattern before the checkered pattern is superimposed. However, in a case in which the checkered pattern is superimposed, as shown in FIG. 7A, intensity peaks caused by the checkered pattern are formed, and the signal light intensity is made uniform.

Next, only a reference light pattern was illuminated by laser light of a wavelength of 532 mm onto the recorded hologram, the diffracted light which was played-back was inverse Fourier transformed by the Fourier transform lens, and the playback image which was imaged at the focal plane of the Fourier transform lens was detected at the light detector. The image shown in FIG. 6B was played-back from the hologram which recorded the Fourier transform image shown in FIG. 6A. In contrast, when the checkered pattern was superimposed, the image shown in FIG. 7B was played-back.

Figure 6B:
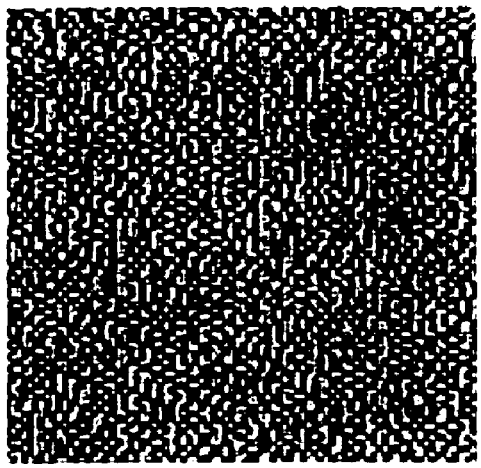
FIG. 6B is a drawing showing a result of Example 1.
Figure 7B:
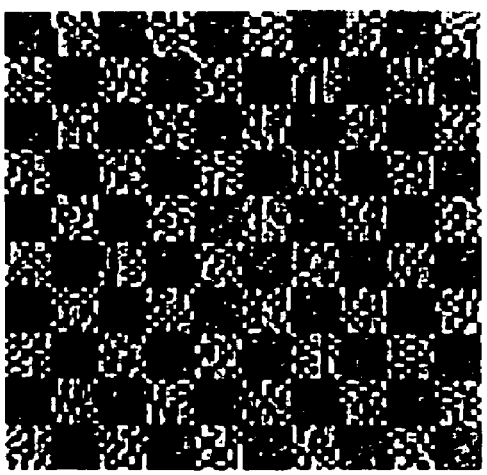
FIG. 7B is a drawing showing a result of Example 1.
Figure 8A:
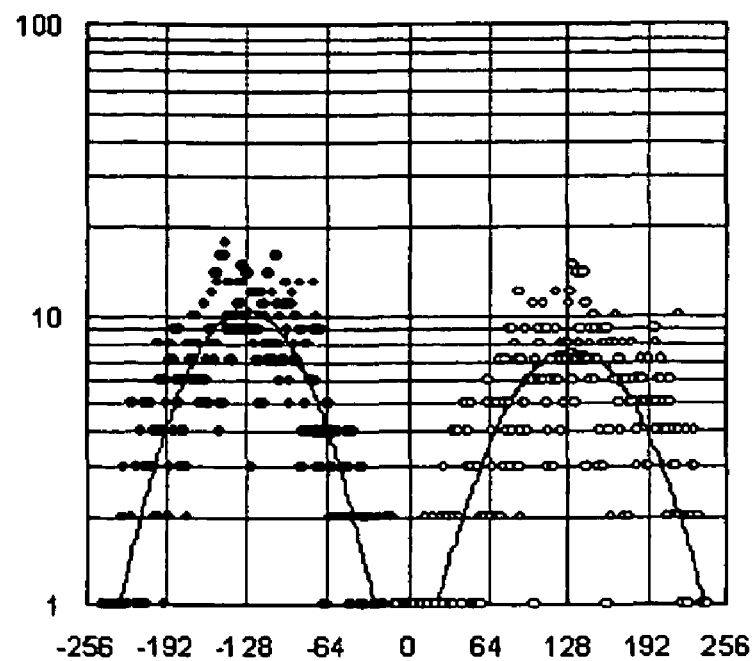
FIG. 8A is a drawing showing histograms of signals decoded from playback images.
Figure 8B:
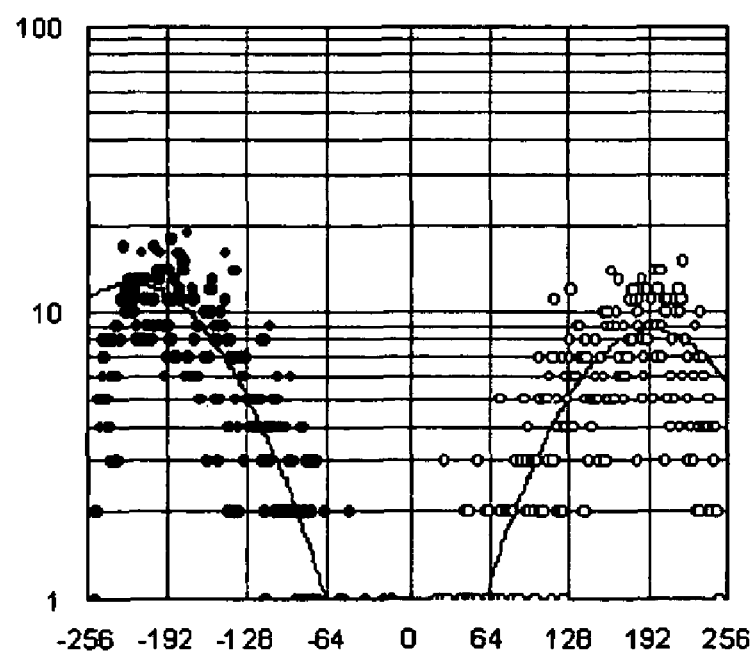
FIG. 8B is a drawing showing histograms of signals decoded from playback images.

FIGS. 8A and 8B are drawings showing histograms of the signals decoded from the playback images of FIGS. 6B and 7B, respectively. Each signal expresses the difference in the luminance level detected at the CMOS sensor array of two pixels expressing one bit. The black circles correspond to cases in which the recorded original data is "0", and the white circles correspond to cases in which the recorded original data is "1". The more the both distributions are separated, the more correctly the original data is decoded. The solid lines in the drawings are the respective distributions fit by normal distributions by using the method of least squares. The bit error rate (BER) can be estimated from the overlapping of the distributions corresponding to "0", "1" of the respective digital data. Further, the S/N can be evaluated from the average values and the variances of the both distributions, by using the following formula.

$$SNR=(\mu_{one}-\mu_{zero})/(\sigma_{one}^2+\sigma_{zero}^2)^{1/2}$$

Here, $\mu_{one}$ and $\mu_{zero}$ express the average values of the distributions corresponding to "0" and "1" of the digital data, and $\sigma_{one}^2$ and $\sigma_{zero}^2$ express the variances of the distributions corresponding to "0" and "1" of the digital data. In the conventional method in which a checkered pattern was not superimposed, when the signal was decoded from the playback image shown in FIG. 6B, BER=2.4×10$^{-3}$, SNR=3.6. In contrast, in the present invention in which the checkered pattern was superimposed, when the signal was decoded from the playback image shown in FIG. 7B, BER=6.8×10$^{-4}$, SNR=4.4. The BER of the playback data was improved by one order, and the S/N was also improved.

EXAMPLE 2

Circle Array Pattern

An experiment was carried out by using the same hologram recording/playback device as in Example 1. However, recording onto an optical recording medium was not carried out, the light detector was disposed at the position of the optical recording medium, and the Fourier transform image of the digital pattern was observed. In Example 2, a circle array pattern, in which circular light portions were arranged periodically with respect to a background which was dark portions, was superimposed on a pattern in which one bit of the digital data was expressed by one pixel (reduced to 12.6 μm×12.6 μm by relay lenses that were not shown in FIG. 15). In this circle array pattern, the circular light portions are arranged so as to become a most densely packed structure of a period of 403 μm, and the ratio of the light portions (white ratio) is 90% which is high.

A combined pattern, in which the above-described circle array pattern was superimposed, was displayed on the reflecting-type spatial light modulator, laser light of a wavelength of 532 nm was illuminated on the spatial light modulator, and signal light (a digital pattern) in which a periodic intensity distribution was superimposed was generated (see FIG. 10A). Because the white ratio of the circle array pattern is high, the capacity of the recorded digital data can be improved. For comparison, the pattern before superimposition of the circle array pattern was displayed on the spatial light modulator and a digital pattern (see FIG. 9A) was generated, and in the same way as described above, the Fourier transform image of the digital pattern was observed.

As shown in FIG. 9B, a strong dc component (0-order light component) exists in the Fourier transform image of the digital pattern before the circle array pattern is superimposed. However, when the circle array pattern is superimposed, as shown in FIG. 10B, intensity peaks caused by the circle array pattern are formed, and the signal light intensity is made uniform. Further, differently from the checkered pattern, discrete intensity peaks can be formed in a direction (oblique direction) which is different from the periodicity of the digital data, and the intensity peaks of the signal light can be effectively dispersed.

As described above, in the present exemplary embodiment, signal light, at which a periodic intensity distribution or phase distribution is superimposed, is Fourier transformed. Therefore, the 0-order component of the signal light can be shifted toward the high-frequency side, and the intensity distribution of the Fourier transform image to be recorded can be made to be uniform. The S/N of the playback data is thereby improved.

Further, in the present exemplary embodiment, the combined pattern is generated by superimposing a periodic pattern on a pattern which is generated in accordance with digital data. By displaying this combined pattern on a spatial light modulator, laser light is intensity-modulated, and signal light, in which a periodic intensity distribution or phase distribution is superimposed, is generated. Therefore, there is no need for an expensive random phase mask, and the intensity distribution of a Fourier transform image can be made to be uniform by an inexpensive and simple method.

In addition, as compared with a case using a random phase mask, no complex speckle noise is generated, and the signal light can be appropriately diffracted by a periodic pattern. Therefore, there is the advantage that sufficient depth of focus can be ensured.

Note that the present exemplary embodiment describes an example in which the combined pattern is displayed on a spatial light modulator. However, similar effects can be achieved even when using a spatial light modulator having a periodic pattern which is independent of the digital pattern, such as, for example, blocks, which generate a frequency component which is lower than the maximum frequency of the digital pattern, are formed in advance, or the like.

Moreover, the present exemplary embodiment describes an example in which a periodic pattern is superimposed only on signal light. However, in a structure in which reference light is Fourier transformed and illuminated onto an optical recording medium, a similar periodic pattern can be superimposed on the reference light as well. In addition, it is possible to carry out recording at an even higher SNR by superimposing on the reference light a periodic pattern which is different than the periodic pattern superimposed on the signal light, in order to illuminate the reference light efficiently at a specific frequency region of the signal light.

Second Exemplary Embodiment

The first exemplary embodiment describes an example in which a periodic pattern is superimposed on a pattern generated in accordance with digital data, so as to generate a combined pattern. This combined pattern is displayed on a spatial light modulator, laser light is intensity-modulated, and signal light is generated. However, in the second exemplary embodiment, a periodic mask is placed between the spatial light modulator and the optical recording medium, and this periodic mask imparts a periodic intensity distribution to the signal light.

Figure 11:
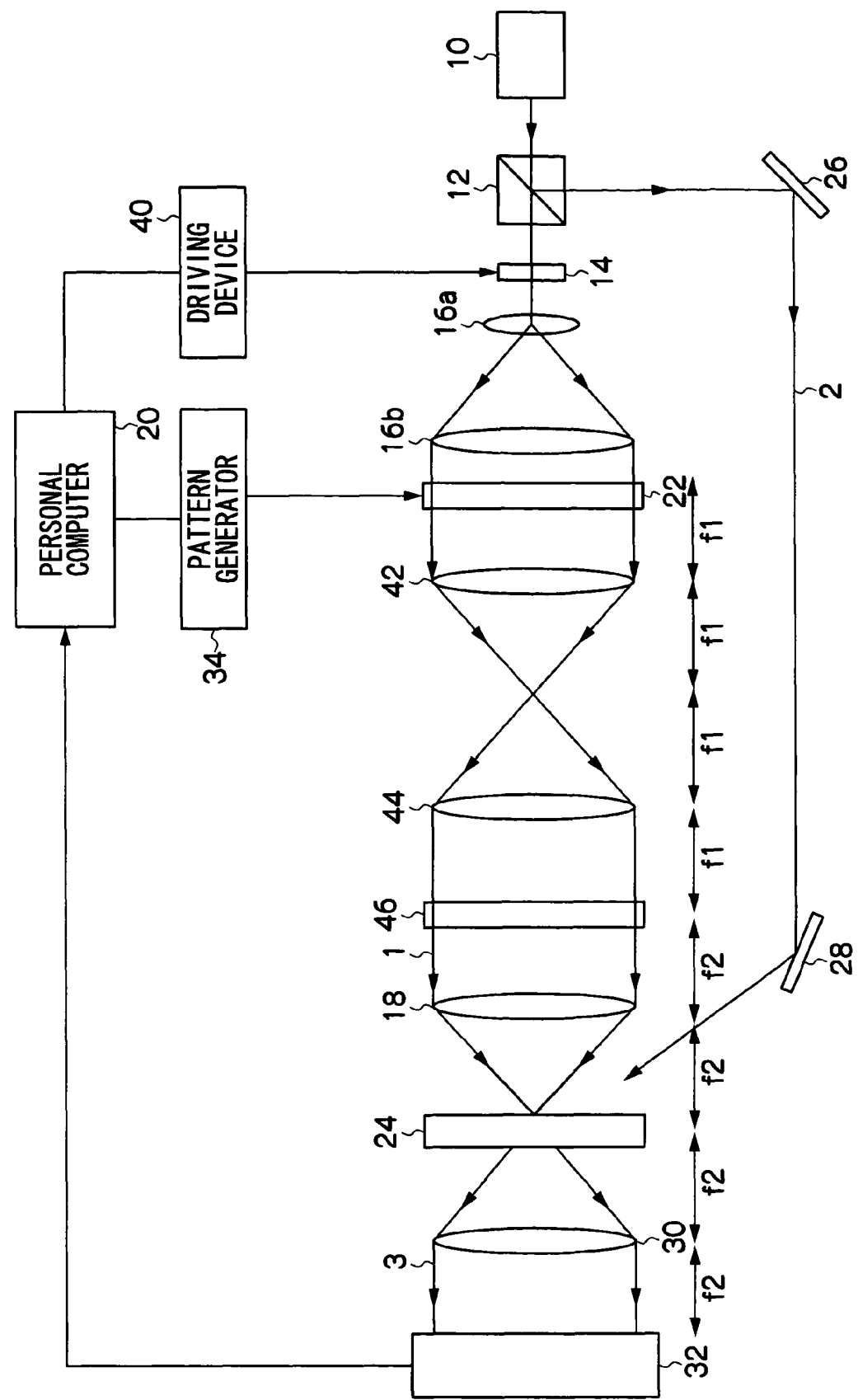
FIG. 11 is a drawing showing the schematic structure of a hologram recording/playback device relating to a second exemplary embodiment.

FIG. 11 is a diagram showing the schematic structure of a hologram recording/playback device relating to the second exemplary embodiment.

In this device, lenses 42, 44, and a periodic mask 46 which superimposes a periodic intensity distribution onto the intensity distribution of the signal light, are disposed in that order between the spatial light modulator 22 and the Fourier transform lens 18. Because other structures are similar to those of the device shown in FIG. 5, the same members are denoted by the same reference numerals, and description thereof is omitted.

Figure 12A:
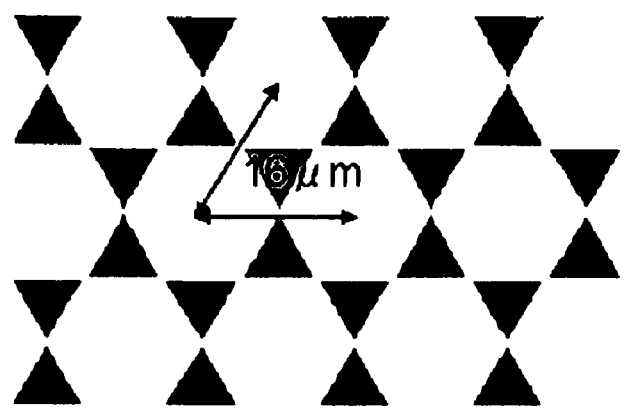
FIG. 12A is a drawing showing a periodic pattern generated from a periodic mask.

The periodic mask 46 is a mask which generates a periodic pattern in which light portions are arranged periodically with respect to a background which is dark portions. Light-blocking portions are provided in correspondence with the dark portions, and opening portions are provided in correspondence with the light portions. For example, as shown in FIG. 12A, in a periodic mask which generates a hexagon array pattern in which regular hexagonal light portions are arranged periodically with respect to the background which is dark portions, a large number of regular hexagonal opening portions are provided in a light-blocking member, and these opening portions are arrayed periodically.

The above-described periodic mask 46 can be produced by using a transparent member such as glass or the like as a substrate, carrying out masking with a photoresist or the like, forming a material, which can reflect or absorb light of the wavelength which is used, by deposition or sputtering or the like, and, thereafter, removing the resist.

Further, given that the focal lengths of the lenses 42, 44 are f1, the spatial light modulator 22 and the lenses 42, 44 and the periodic mask 46 are disposed so as to be separated from one another by distance f1. Given that the focal lengths of the Fourier transform lenses 18, 30 are f2, the periodic mask 46, the Fourier transform lens 18, the optical recording medium 24, the Fourier transform lens 30, and the light detector 32 are disposed such that the adjacent ones of these members are separated from one another by distance f2. Namely, the periodic mask 46 is disposed such that the signal light is imaged on the light detector 32.

Hologram recording using the above-described recording/playback device will be described next.

First, the shutter 14 is withdrawn from the optical path by the driving device 40, such that laser light can pass through. The laser light oscillated from the light source 10 is separated by the beam splitter 12 into light for signal light and light for reference light. The laser light which is transmitted through the beam splitter 12 is collimated into a large-diameter beam by the collimator lenses 16a, 16b, and is illuminated onto the spatial light modulator 22 as light for signal light.

Digital data is inputted to the pattern generator 34 from the personal computer 20. At the pattern generator 34, a pattern to be displayed on the spatial light modulator 22 is generated in accordance with the supplied digital data. At the spatial light modulator 22, the laser light for signal light is intensity-modulated in accordance with the displayed pattern. Due to the intensity-modulated laser light being transmitted through the periodic mask 46 via the lenses 42, 44, an intensity distribution is superimposed thereon and the signal light 1 is generated.

The generated signal light 1 is Fourier transformed by the Fourier transform lens 18, and is illuminated onto the optical recording medium 24. Simultaneously, the laser light reflected at the beam splitter 12 is reflected at the reflecting mirrors 26, 28, and is illuminated onto the optical recording medium 24 as the reference light 2. The reference light 2 is illuminated onto the region where the signal light 1 after the Fourier transformation is illuminated. In this way, the signal light 1 after the Fourier transformation and the reference light 2 interfere within the optical recording medium 24, and the signal light 1 is recorded as a hologram within the optical recording medium 24.

At the time of playback of the hologram, the shutter 14 is inserted onto the optical path by the driving device 40, such that the light for signal light is blocked. In this way, only the reference light 2 is illuminated onto the region of the optical recording medium 24 were the hologram is recorded. The illuminated reference light 2 is diffracted by the hologram. Because the Fourier transform image is recorded on the optical recording medium 24, due to the diffracted light 3 being inverse Fourier transformed by the Fourier transform lens 30, the playback image can be observed at the focal plane of the Fourier transform lens 30. This playback image is detected by the light detector 32, and the digital data held by the signal light can be read.

EXAMPLE 3

Hexagon Array Pattern

An experiment was carried out by using the hologram recording/playback device shown in FIG. 11. A continuous oscillation green laser "Verdi" (wavelength: 532 nm) manufactured by Coherent Inc. was used as the light source 10. An LCD spatial light modulator "LCX038" (pixels: 1024 (horizontal)×768 (vertical), pixel pitch: 14 μm) manufactured by Sony Corporation was used as the spatial light modulator 22. A zoom lens (focal length: 80 mm to 200 mm) manufactured by Nikon Corporation was used as the lens 42, and a lens of a focal length of 50 mm was used as the lens 44. A photomask, in which chrome was deposited as light-blocking portions in accordance with a periodic pattern, was used as the periodic mask 46. Objective lenses (NA: 0.28, focal length: 20 mm) of a high NA (numerical aperture) used in microscopes and the like were used as the Fourier transform lenses 18, 30. A CMOS sensor array (pixels: 1280 (horizontal)×1024 (vertical), pixel pitch: 6.7 μm, pickup surface area: 8.6 mm×6.9 mm) manufactured by Lumenera Corporation was used as the light detector 32.

As shown in FIG. 12A, by using a periodic mask generating a hexagon array pattern in which regular hexagonal light portions were arranged periodically with respect to a background which was dark portions, the hexagon array pattern was superimposed on a pattern expressed by a differential coding method in which 1 bit of the digital data was expressed by 1 pixel (reduced to 6.3 μm×6.3 μm). In this hexagon array pattern, the regular hexagons are arranged so as to become a most densely packed structure of a period of 16 μm, and the ratio of the light portions (white ratio) is 75% which is high.

A pattern corresponding to digital data was displayed on the transmitting-type spatial light modulator, laser light of a wavelength of 532 nm was illuminated onto the spatial light modulator, and the laser light was intensity-modulated. The intensity-modulated laser light was illuminated onto the periodic mask, signal light (a digital pattern) in which a periodic intensity distribution was superimposed was generated, and this signal light was Fourier transformed by the Fourier transform lens. Then, the light detector was placed at the position of the optical recording medium, and the Fourier transform image of the digital pattern was observed without carrying out recording onto an optical recording medium. For comparison, the periodic mask was withdrawn, and the Fourier transform image of the signal light before superimposition of the hexagonal array pattern was observed.

Figure 12B:
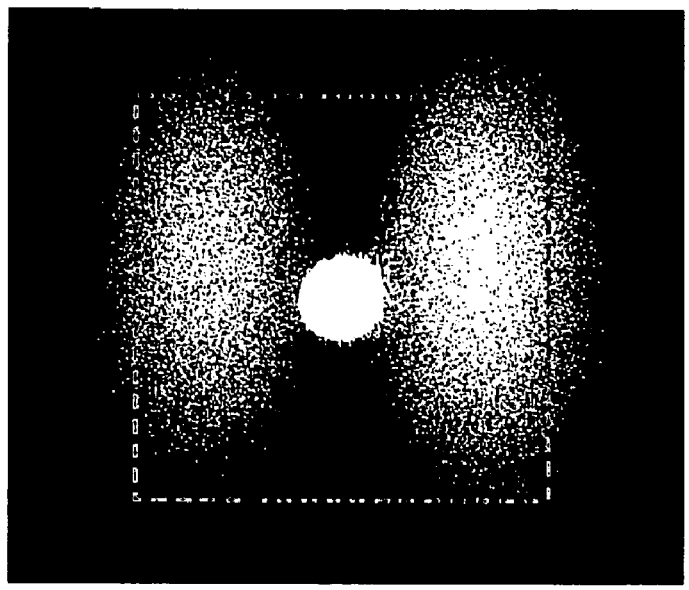
FIG. 12B is a drawing showing the results of Example 3.
Figure 12C:
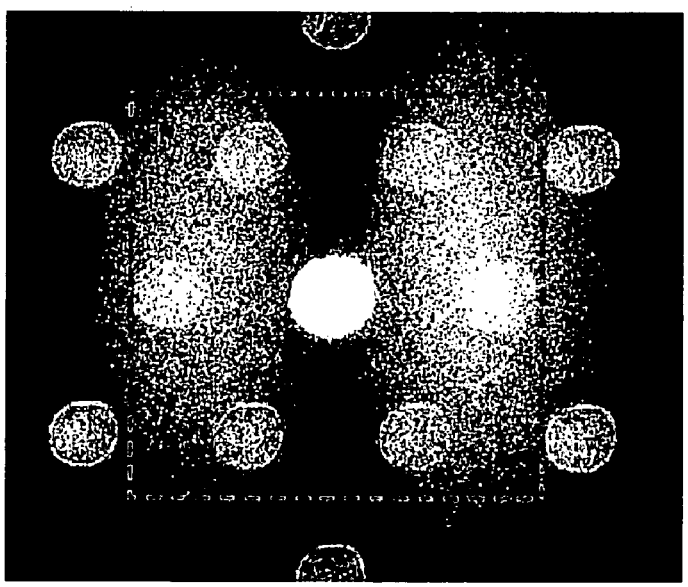
FIG. 12C is a drawing showing the results of Example 3.

As shown in FIG. 12B, a strong dc component (0-order light component) exists in the Fourier transform image of the digital pattern before the hexagon array pattern is superimposed. However, when the hexagon array pattern is superimposed, as shown in FIG. 12C, intensity peaks caused by the hexagon array pattern are formed, and the signal light intensity is made uniform. Further, differently from the checkered pattern, discrete intensity peaks can be formed in a direction (oblique direction) which is different from the periodicity of the digital data, and the intensity peaks of the signal light can be effectively dispersed.

As described above, in the present exemplary embodiment, signal light, in which a period intensity distribution or phase distribution is superimposed, is Fourier transformed. Therefore, the 0-order component of the signal light can be shifted toward the high-frequency side, the intensity distribution of the Fourier transform image to be recorded can be made to be uniform, and the S/N of the playback data is improved.

Further, in the present exemplary embodiment, laser light is intensity-modulated by being transmitted through the periodic mask, and signal light, at which a periodic intensity distribution is superimposed, is generated. Therefore, there is no need for an expensive random phase mask, and the intensity distribution of a Fourier transform image can be made to be uniform by an inexpensive and simple method. Moreover, if an intensity-modulating mask is used, highly-precise masks can be mass produced at a low cost.

In addition, as compared with a case using a random phase mask, no complex speckle noise is generated, and the signal light can be appropriately diffracted by a periodic pattern. Therefore, there is the advantage that sufficient depth of focus can be ensured.

Third Exemplary Embodiment

The second exemplary embodiment describes an example in which a periodic mask is disposed such that the signal light is imaged on the light detector. However, in the third exemplary embodiment, the periodic mask is disposed so as to be offset from the focal point position of the lens (defocused).

Figure 13:
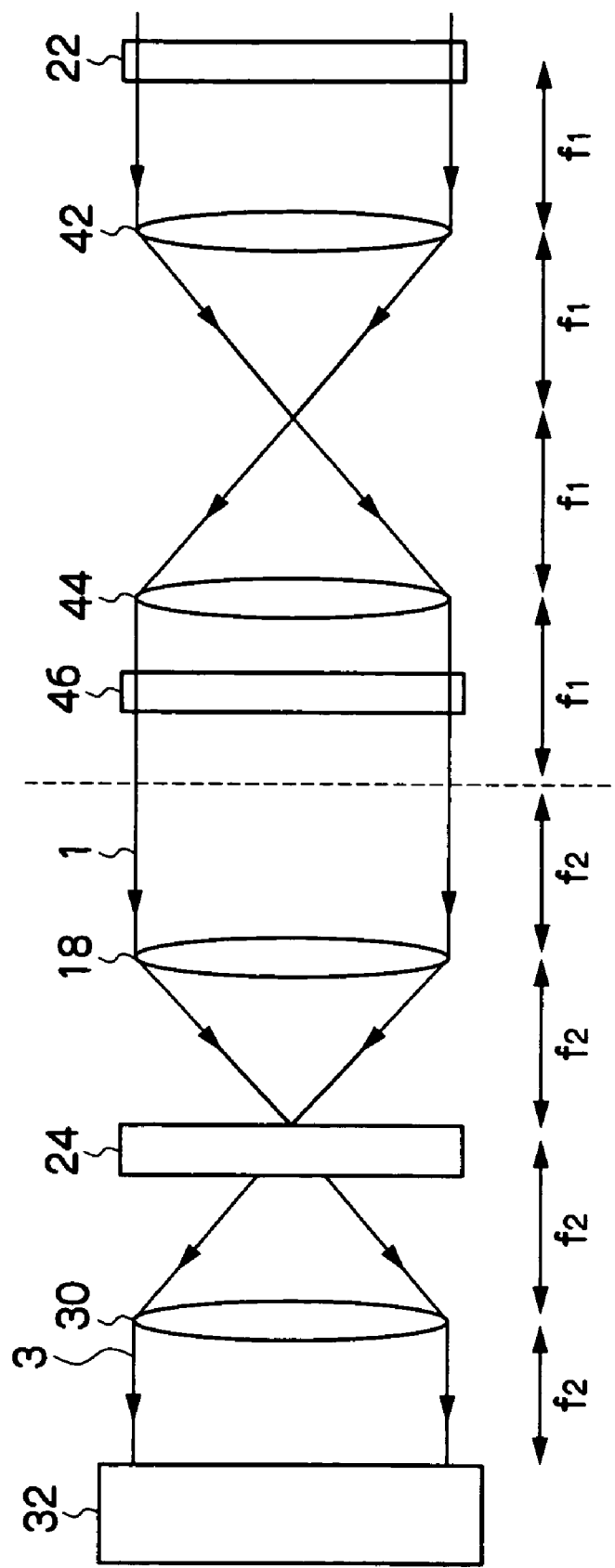
FIG. 13 is a drawing showing a placement position of a periodic mask.

FIG. 13 is a partial structural diagram of a hologram recording/playback device relating to the third exemplary embodiment. As shown in FIG. 13, the periodic mask 46 is disposed so as to be offset from the focal point positions of the Fourier transform lens 18 and the lens 44 (the imaging plane shown by the dotted line). By defocusing the periodic mask 46 from the imaging plane, the periodic pattern is not imaged on the light detector, and it is possible to detect only the pattern which corresponds to the digital data. The intensity distribution of the Fourier transform image can be made uniform, without sacrificing the data region of the spatial light modulator.

FIG. 14A is a playback image in a case in which the periodic mask is placed at the imaging plane, and FIG. 14B is a playback image in a case in which the periodic mask is placed at a non-imaging plane. As can be understood from these results, by defocusing the periodic mask from the imaging plane, it is possible to image only the pattern which corresponds to the digital data. At this time, an interference pattern (speckle noise) caused by the superimposed periodic pattern appears, but because this pattern is periodic, it can be simply corrected (removed) by carrying out a known filtering processing on the playback image.

Figure 16:
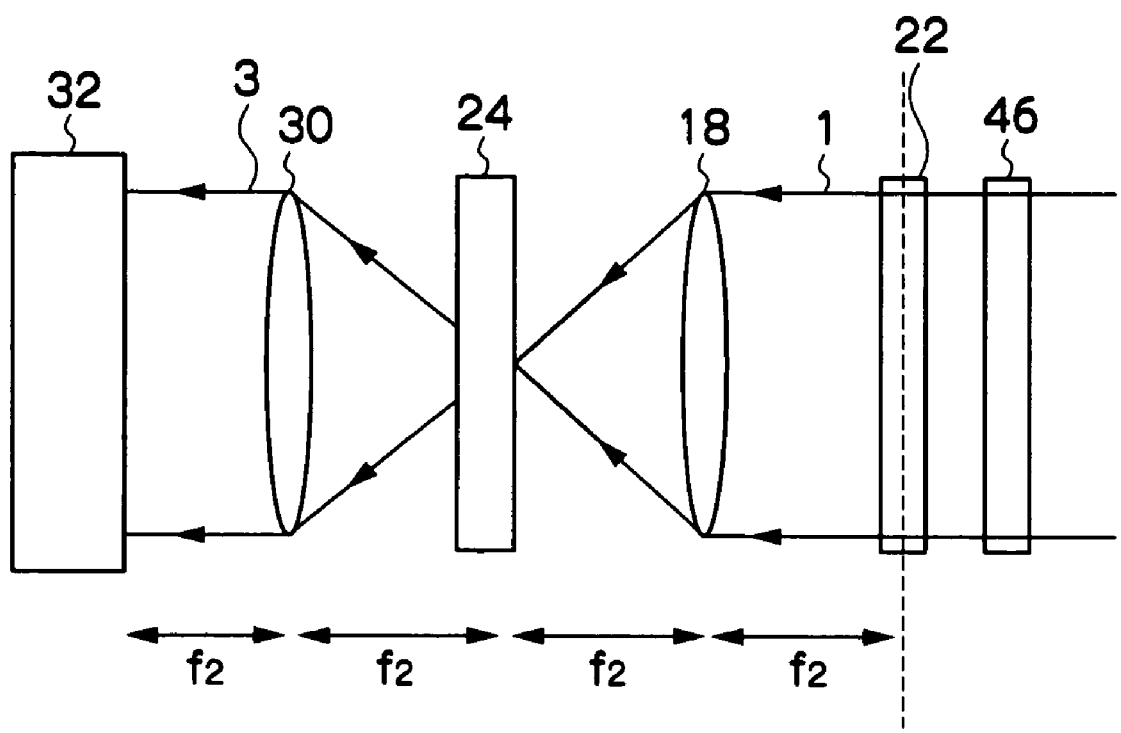
FIG. 16 is a drawing showing another example of a placement position of a periodic mask.

Note that the second and the third exemplary embodiments describe examples in which the lenses 42, 44 and the periodic mask 46 are disposed between the spatial light modulator 22 and the Fourier transform lens 18. However, as shown in FIG. 16, the lenses 42, 44 can be omitted and the periodic mask 46 placed at the optical path upstream side of the spatial light modulator 22. In this case, the spatial light modulator 22 is disposed at the focal point positions of the Fourier transform lenses 18, 30, but because the periodic mask 46 is disposed so as to be offset from the imaging position of the light detector 32, similarly, it is possible to detect only the pattern which corresponds to the digital data without imaging the periodic pattern on the light detector 32.

Further, the second and third exemplary embodiments describe examples using a periodic mask in which a periodic intensity distribution is superimposed (intensity mask). However, a periodic mask in which a periodic phase distribution is superimposed (phase mask) can be used. For example, it is possible to use a phase mask whose film thickness differs in accordance with the light portions and the dark portions of the intensity periodic pattern (i.e., at which convex and concave portions are formed), and whose transmittance at the wavelength which is used is high.

Glass, plastic, or the like can be used as the mask substrate. For example, a phase mask can be manufactured by masking a glass substrate by a photoresist or the like, and forming convex and concave portions by etching, deposition, sputtering, or the like. Further, in the case of a plastic substrate, the mask can be manufactured by a stamper or injecting molding or the like by using a mold. In addition, a microlens array, which has a frequency component which is lower than the maximum frequency of the data, can be used as the periodic phase mask.

In the first through third exemplary embodiments, a checkered pattern in which light portions and dark portions are arranged in a grid-like form, a circle array pattern in which circles which are light portions are arranged periodically with respect to the background which is dark portions, a hexagon array pattern in which polygons which are light portions are arranged periodically with respect to the background which is dark portions, and the like are examples of the periodic pattern. However, it suffices for the periodic pattern to be able to form a Fourier transform image having plural intensity peaks within the minimum recording region needed, and the pattern is not limited to those exemplified above.

Triangles, pentagons, and the like may of course be used as the polygons which are the light portions. For example, a striped pattern in which the light portions and the dark portions are lined-up alternately, a reversed pattern in which the light portions and the dark portions are reversed, or the like may be used. Further, other than periodic patterns in which circles or polygons are arranged most densely, periodic patterns in which the dark portions and the light portions are isolated from one another such as shown in FIG. 17 can also be used.

In the case of a periodic pattern expressed by a light/dark image, it is more preferable that the ratio of the light portions (the white ratio) is high. The higher the white ratio, the more the capacity of the recorded digital data can be improved. Further, when the light/dark image of the digital data to be recorded is a checkered pattern, it is preferable to use a periodic pattern which is different than a checkered pattern. FIGS. 18A through 18D show Fourier transform images in cases in which various periodic patterns are superimposed. As compared with the case of superimposing a checkered pattern (FIG. 18A), in cases in which a circle array pattern, a triangle array pattern, and a hexagon array pattern are superimposed (FIGS. 18B through 18D), it is possible to form discrete intensity peaks in a direction (oblique direction) which is different than the periodicity of the digital data, and the intensity peaks of the signal light can be dispersed effectively.

What is claimed is:

1. A hologram recording method comprising:

generating signal light which has (a) a periodic first intensity distribution that expresses a periodic pattern by a first light/dark image and (b) a second intensity distribution that expresses binary digital data by a second light/dark image, wherein the first intensity distribution and the second intensity distribution have different spatial frequencies, and the first intensity distribution and the second intensity distribution are overlapped such that only portions of one of the first intensity distribution or the second intensity distribution corresponding to light portions of the other one of the first or second intensity distribution are superimposed at the light portions of the other one of the first intensity distribution or the second intensity distribution;

Fourier transforming the signal light;

illuminating Fourier transformed signal light and reference light simultaneously on an optical recording medium; and recording the signal light as a hologram, wherein the signal light is generated and made to be incident in the optical recording medium without passing through a phase modulating element.

2. A hologram recording device comprising:

a light source illuminating coherent light;

a pattern generator generating combined pattern data by combining pattern data, which expresses a periodic first intensity distribution, with binary digital data, the combined pattern having the periodic first intensity distribution and a second intensity distribution expressing the binary digital data overlapped with each other such that the first intensity distribution and the second intensity distribution have different spatial frequencies, and only portions of one of the first intensity distribution or the second intensity distribution corresponding to light portions of the other one of the first or second intensity distribution are superimposed at the light portions of the other one of the first intensity distribution or the second intensity distribution;

a spatial light modulator intensity-modulating light illuminated from the light source in accordance with the combined pattern data generated at the pattern generator, and generating signal light;

an imaging optical system that Fourier transforms the signal light; and a reference light optical system obtaining reference light from light illuminated from the light source, wherein the signal light after the Fourier transformation and the reference light are illuminated simultaneously onto an optical recording medium, and the signal light is recorded as a hologram, and the signal light is generated and made to be incident in the optical recording medium without passing through a phase modulating element.

3. A hologram recording device comprising:

a light source illuminating coherent light;

a spatial light modulator intensity-modulating light illuminated from the light source in accordance with binary digital data, and generating light having a second intensity distribution which expresses the digital data as a light/dark image;

a reference light optical system obtaining reference light from light illuminated from the light source;

an intensity mask at which light transmitting portions and light-blocking portions are arranged periodically to form a periodic first intensity distribution and disposed at the light exiting side of the spatial light modulator, and, due to light generated at the spatial light modulator passing through the mask, the mask generates signal light having the periodic first intensity distribution and the second intensity distribution overlapped with each other such that the first intensity distribution and the second intensity distribution have different spatial frequencies, and only portions of and one of the first intensity distribution or the second intensity distribution corresponding to light portions of the other one of the first or second intensity distribution are superimposed at light portions of the other one of the first intensity distribution or the second intensity distribution; and an imaging optical system that Fourier transforms the signal light, wherein the signal light after the Fourier transformation and the reference light are illuminated simultaneously onto an optical recording medium, and the signal light is recorded as a hologram on the optical recording medium, and in the signal light is generated and made to be incident in the optical recording medium without passing through a phase modulating element.

4. A hologram recording device comprising:

a light source illuminating coherent light;

a reference light optical system obtaining reference light from light illuminated from the light source;

an intensity mask at which light transmitting portions and light-blocking portions are arranged periodically and disposed at a light emitting side of the light source, and, due to light illuminated from the light source passing through the mask, the mask imparts a periodic first intensity distribution to the light;

a spatial light modulator disposed at a light exiting side of the mask, and generating signal light by, in accordance with binary digital data expressed by a second intensity distribution, the first intensity distribution and the second intensity distribution having different spatial frequencies, intensity-modulating the light to which the periodic first intensity distribution has been imparted such that only portions of one of the first intensity distribution or the second intensity distribution corresponding to light portions of the other one of the first or second intensity distribution are superimposed at light portions of the other one of the first intensity distribution or the second intensity distribution; and an imaging optical system that Fourier transforms the signal light, wherein the signal light after the Fourier transformation and the reference light are illuminated simultaneously onto an optical recording medium, and the signal light is recorded as a hologram on the optical recording medium, and the signal light is generated and made to be incident in the optical recording medium without passing through a phase modulating element.

* * * * *